United States Patent
Waayers

(10) Patent No.: US 7,941,717 B2
(45) Date of Patent: May 10, 2011

(54) IC TESTING METHODS AND APPARATUS

(75) Inventor: Tom Waayers, Sint Michielsgestel (NL)

(73) Assignee: NXP B.V., Eindhoven (NL)

( * ) Notice: Subject to any disclaimer, the term of this patent is extended or adjusted under 35 U.S.C. 154(b) by 222 days.

(21) Appl. No.: 12/090,950

(22) PCT Filed: Oct. 12, 2006

(86) PCT No.: PCT/IB2006/053755
§ 371 (c)(1),
(2), (4) Date: Apr. 21, 2008

(87) PCT Pub. No.: WO2007/049172
PCT Pub. Date: May 3, 2007

(65) Prior Publication Data
US 2008/0265906 A1    Oct. 30, 2008

(30) Foreign Application Priority Data
Oct. 24, 2005 (EP) ................................ 05109893

(51) Int. Cl.
*G01R 31/28* (2006.01)
(52) U.S. Cl. ......... 714/727; 714/729; 714/724; 714/742
(58) Field of Classification Search ............... 714/727, 714/729, 742, 724
See application file for complete search history.

(56) References Cited

U.S. PATENT DOCUMENTS

| | | |
|---|---|---|
| 5,150,044 A | 9/1992 | Hashizume et al. |
| 5,781,560 A | 7/1998 | Kawano et al. |
| 6,611,934 B2 * | 8/2003 | Whetsel, Jr. .................. 714/727 |
| 6,643,810 B2 * | 11/2003 | Whetsel ........................ 714/724 |
| 6,813,738 B2 * | 11/2004 | Whetsel, Jr. .................. 714/727 |
| 7,047,467 B1 * | 5/2006 | Khu et al. ...................... 714/727 |
| 7,401,277 B2 * | 7/2008 | Yamada et al. ................ 714/726 |
| 7,409,612 B2 * | 8/2008 | Van De Logt et al. ........ 714/727 |
| 7,506,231 B2 * | 3/2009 | Chang et al. .................. 714/726 |

(Continued)

FOREIGN PATENT DOCUMENTS
JP      1-263739 A      10/1989

(Continued)

OTHER PUBLICATIONS
Fang et al., "Power-Constrained Embedded Memory BIST Architecture", 2003, IEEE International Symposium on Defect and Fault Tolerance in VLSI Systems, pp. 451-458.*

(Continued)

*Primary Examiner* — John J Tabone, Jr.

(57) ABSTRACT

A method and apparatus for testing an integrated circuit core or circuitry external to an integrated circuit core using a testing circuit passes a test vector from a parallel input of the testing circuit along a shift register circuit. The shift register circuit is configured to bypass one or more cores not being tested and to provide the test vector to a core scan chain of the core being tested. The bypassed cores are configured such that the associated shift register circuit portion is driven to a hold mode in which storage elements of the shift register circuit portion have their outputs coupled to their inputs. This method provides holding of the shift register stages when a core is bypassed and in a test mode, and this means the shift register stages are less prone to errors resulting from changes in clock signals applied to the shift register stages.

22 Claims, 6 Drawing Sheets

U.S. PATENT DOCUMENTS

| | | | |
|---|---|---|---|
| 7,620,866 B2 * | 11/2009 | Marinissen et al. | 714/727 |
| 2003/0101397 A1 * | 5/2003 | Whetsel, Jr. | 714/726 |
| 2004/0199839 A1 * | 10/2004 | Whetsel, Jr. | 714/726 |
| 2005/0204236 A1 | 9/2005 | Whetsel | |
| 2006/0156104 A1 * | 7/2006 | Chang et al. | 714/724 |
| 2008/0034334 A1 * | 2/2008 | Laouamri et al. | 716/4 |

FOREIGN PATENT DOCUMENTS

| | | | |
|---|---|---|---|
| JP | 4-211842 A | 8/1992 | |
| JP | 7-260883 A | 10/1995 | |
| WO | 2004070395 A2 | 8/2004 | |
| WO | 2007049171 A1 | 5/2007 | |
| WO | 2007049173 A1 | 5/2007 | |

OTHER PUBLICATIONS

DaSilva et al., "Overview of the IEEE P1500 Standard", 2003, ITC International Test Conference, pp. 988-997.*

Dervisoglu, "A Unified DFT Architecture for use with IEEE 1149.1 and VSINIEEE P1500 Compliant Test Access Controllers", Jun. 18-22, 2001, DAC 2001, pp. 53-58.*

Li, et al., "A Hierarchical Test Scheme for System-on-Chip Designs", Mar. 4-8, 2002, Design, Automation and Test in Europe Conference and Exhibition (Date'02), pp. 486-490.*

Vermaak, H., J; et al "Using the Oscillation Test Method to Test for Delay Faults in Embedded Cores" Africon, 2004. 7th Africon Conference in Africa Gaborone, Botswana. vol. 2, Sep. 15, 2004, pp. 1105-1110.

Waayers, Tom—Institute of Electrical and Electronics Engineers: "An Improved Test Control Architecture and Test Control Expansion for Core-Based System Chips" Proceedings International Test Conference 2003. (ITC). vol. 1, Sep. 30, 2003, pp. 1145-1154.

Benabdenbi, M; et al "Testing Taped Cores and Wrapped Cores With the Same Test Access Mechanism" Design, Automation and Test in Europe, 2001. Conference and Exhibition 2001. Proceedings. Mar. 13, 2001, pp. 150-155.

Marinissen, E., J; et al "Infrastructure for Modular SOC Testing" Custom Integrated Circuits Conference, 2004. Proceedings of the IEEE 2004. Oct. 3, 2004, pp. 671-678.

Vermeulen, B; et al "IEEE 1149.1-Compliant Access Architecture for Multiple Core Debug on Digital System Chips" Proceedings International Test Conference 2002. ITC 2002. Oct. 7, 2002, pp. 55-63.

* cited by examiner

IC TESTING METHODS AND APPARATUS

The present invention generally relates to testing of semiconductor integrated circuits, and in particular relates to a core test method and apparatus.

One common testing technique for the testing of semiconductor integrated circuits (ICs) is a scan testing technique. This essentially involves launching a test pattern (termed "vector") into the pins of a device package and monitoring an output response at a specific time, dependent on the clock speed of the device. A set of test vectors is used to enable the behaviour of the device under test to be determined. These vectors are designed to enable detection of manufacturing defects in the device.

As the number of transistors used in integrated circuits grows, the ability to reuse integrated circuit designs becomes increasingly important. One important issue concerning the reuse of design functions (termed "cores") is the ability to test these cores without re-engineering the testing methodology, so that test reuse can be implemented as well as design reuse. The testing of System on Chip (SoC) circuits with multiple functional cores also becomes an increasing challenge.

Primarily to address these issues, the IEEE P1500 working group was formed, and has developed a core level solution to facilitate test integration and test reuse. The standard has now been adopted as IEEE STD 1500 and provides a standard interface and a set of rules defining the boundary between a core and the logic external to the core. This boundary is termed a "wrapper", and allows the isolated test of a core with minimum signals that must be routed outside the system on chip structure. The wrapper comprises so-called "wrapper cells" for each functional input and functional output of the core.

FIG. 1 shows the basic layout of an IEEE STD 1500 wrapper. The core 1 is surrounded by the wrapper 2, which acts as an interface between all external signals and the core. The wrapper has a wrapper boundary register (WBR) between the core Functional Inputs (FI)/Outputs (FO) and the wrapper functional inputs/outputs. The core terminals are shown as 4, and some of these are functional inputs and some are functional outputs. The standard dictates that the core 1 is defined with unidirectional terminals. The arrows 6 show schematically that the Wrapper Boundary Register acts as the interface between the external functional inputs and outputs and the core functional inputs and outputs.

The Wrapper Boundary Register WBR comprises a chain of cells 8, each associated with an individual functional input or output of the core. These cells are configured into a scan chain to supply the desired test vectors for the control of the core functional inputs or to shift out the results present on the core functional outputs. The cells of the WBR thus essentially implement a scan test technique by providing a selected test vector to the functional inputs and outputs of the core.

The wrapper 2 has a Wrapper Serial Input (WSI) and a Wrapper Serial Output (WSO), and these communicate with an instruction register, termed Wrapper Instruction Register (WIR) and with the Wrapper Boundary Register (WBR).

The Wrapper Boundary Register WBR controls and observes the ports 4 of the functional core. The cells 8 of the WBR are configured in response to the instructions provided to the wrapper instruction register WIR, and the Wrapper Instruction Register essentially controls the testing process.

In particular, the WIR and WBR are configured to operate in response to control signals which indicate the commands "Select", "Capture", "Shift" and "Update".

A shift comprises the advance of the data in the WBR one storage position closer to the test output (and also the advance of data in the WIR or other register). Thus, the shift commands load the WBR cells with the desired test vector.

A capture comprises the storing of the data present on the functional inputs or outputs of the WBR into the WBR cells.

An update comprises storing of the data within the WBR cell shift storage element, using an additional update storage element.

A transfer comprises the movement of data to the WBR cell shift storage element.

Although not shown in FIG. 1, the wrapper receives signals in the form of a Wrapper Capture signal (CaptureWR), a Wrapper Shift signal (ShiftWR) and an Update Wrapper signal (UpdateWR). In addition, the wrapper is controlled by a Wrapper Clock Signal (WRCK), a Wrapper Reset Signal (WRSTN) signal and an Instruction Register Selection signal (SelectWIR).

The Wrapper Instruction Register (WIR) is used to configure the wrapper into a desired mode of operation, determined by the instructions shifted into the WIR. This instruction may be tens or hundreds of bits in length, and can define different test and diagnosis modes of operation. Additional circuitry of the WIR (not shown) is used to interpret the loaded WIR instruction and provide the appropriate control signals to the WBR which controls the interaction with the core.

The wrapper uses the same serial input for the loading of the serial test vectors to be shifted into the WBR cells as for the loading of instruction data, and the SelectWIR signal determines which mode of operation is in use.

The WIR thus decodes loaded instructions and then controls the Wrapper Boundary Register WBR to implement the specified control. The WIR circuitry receives the signals CaptureWR, ShiftWR, UpdateWR and the clock signal WRCK, a reset signal WRSTN signal and the signal SelectWIR, discussed above.

The Wrapper Instruction Register can also control a Wrapper Bypass Register (WBY), which is operable to pass a wrapper serial input (WSI) to the wrapper serial output (WSO) without any interaction with the core. This is in response to a WIR instruction. In addition, an external test can be controlled by the WIR to provide external controllability and observability of the core, and this test involves connecting the Wrapper Boundary Register WBR to the Wrapper Serial Input and Output (WSI and WSO). This enables the loading of customer specified data into the WBR cells.

The Wrapper Instruction Register receives its control input from a Wrapper Serial Control (WSC) input.

The terminals above are from the serial port. The wrapper can also have parallel ports, shown in FIG. 1 as a parallel input port PI and a parallel output port PO.

This invention relates in particular to the testing of multiple cores surrounded by a wrapper. In this case, a path for the test signals needs to be provided between the multiple cores, so that a selected core or cores can be tested using the test signal path. If one particular core is to be tested, the others need to be bypassed, so that the test vectors can be routed to the desired core. One way to achieve this is to couple scan chains for different wrappers together in series. For the cores which are not to be tested, a bypass is provided around the internal core scan chain, for example using a single shift register bypass element.

In this approach, the bypass path is active only during shift cycles. Typically, new test vectors are loaded into the chain only after the normal mode test has been carried out for the core being tested, and this means that a delay of a number of clock cycles corresponding to the number of bypassed cores is introduced into each test.

This delay can be reduced by making the bypass paths active during the shift and normal test mode cycles, so that data can be shifted through the bypass paths during testing. This defines a more continuous pipeline.

These approaches can suffer from clocking problems, which can invalidate data in the pipeline. This can arise when switching between internal chip-generated phase locked loop clocks and external clocks of the testing controller. This switching between clock signals takes place when normal mode test cycles are performed, namely the testing of the core response to the loaded test vector. The normal test mode is at a higher frequency using the phase locked loop clock signals, whereas the shifting of data along the pipeline uses the external testing controller clocks.

When the higher speed clock is used, this clocking signal can be coupled to the clock inputs of the other cores. This will depend on the physical architecture of the cores. To provide a wrapper design which does not place unnecessary constraints on the core design, the wrapper needs to allow the higher frequency test clock signal to be coupled to the clock inputs of the other core wrappers.

Each core may also have multiple clock domains, and the cores can operate internally at much higher rates than the testing scan clocking, with the cores generating on-chip clocks from much slower external reference signals. These high frequency clocks and the discontinuous nature of the clocking signals (because there is switching between clocks) can invalidate the data in the pipeline.

According to the invention, there is provided a testing circuit for the testing of an integrated circuit core or circuitry external to an integrated circuit core, the testing circuit comprising:
 a shift register circuit comprising a plurality of cells, for passing test signals, the cells being arranged as a plurality of banks of cells in series;
 a serial input and a serial output for connection to the input and output of the shift register circuit;
 a plurality of parallel inputs and outputs, wherein the parallel inputs are for passing test signals to the integrated circuit core for testing of the core,
 wherein a first bank of bypass multiplexers is controllable either to connect integrated circuit core outputs to the multiplexer outputs or to connect the parallel inputs to the multiplexer outputs thereby bypassing the integrated circuit core,
 wherein each cell comprises a hold input, wherein the hold input is for coupling the output of a storage element of the cell to the input of the storage element of the cell when the testing circuit is operated in a test mode,
 and wherein the circuit is operable in a bypass mode in which the integrated circuit core is bypassed and hold signals are applied to the hold inputs.

This arrangement provides a bypass mechanism as part of the parallel interface, which either passes the parallel inputs to the core to be tested or bypasses the core. The circuit is operable in a bypass mode in which the integrated circuit core is bypassed, and during this time, hold signals are applied so that data in the WBR cells is not corrupted by a higher frequency test clock from the core being tested.

The testing circuit is preferably operable in a shift mode and a test mode, and the circuit can be clocked with different frequency clocks in the test mode and the shift mode. In the test mode, the shifting of data along the shift register is disabled, and a higher clock frequency may be used. The hold function enables the data stored in the shift register circuit to be kept stable.

When multiple testing circuits are connected together, this enables the architecture to tolerate the use of different clock domains for the internal core testing of one core and for the passing of data along the chain of WBR cells. While one core is being tested, a holding function is implemented in the other testing circuits which are in a bypass mode, so that the high speed testing of one core does not influence data stored in the shift register circuit of another testing circuit.

Each cell may have a serial test input, a serial test output, a functional input and a functional output.

Preferably, each cell is configured as one of an input cell for providing signals to the core and an output cell for receiving signals from the core.

The first bank of multiplexers are preferably controlled by a bypass control line.

The shift register circuit may comprise a Wrapper Boundary Register for an embedded core test architecture, for example a Wrapper Boundary Register for an IEEE STD 1500 embedded core test architecture.

A second bank of multiplexers can be provided which is controllable either to connect the outputs of the bypass multiplexers to the banks of the shift register cells in parallel or to connect the banks of cells in series, and a first multiplexer of the second bank of multiplexers either connects the output of a first multiplexer of the first bank of multiplexers to a first bank of cells or else connects the serial input to the first bank of cells. Thus, the second bank of multiplexers enable a serial input to be connected to the first cell and enable the cells to be connected in series, to provide a serial scan chain shift register. An output of a last bank of cells then comprises the serial output.

The parallel outputs are defined preferably at the outputs of the banks of cells. Thus, the parallel interface connects through banks of cells, whereas the serial interface connects through all cells in series.

The configuration can be operated in three modes:
 a core internal test mode, in which the integrated circuit core outputs are connected through the multiplexers of the first and second banks of multiplexers to the banks of shift register cells;
 a core external test mode, in which the integrated circuit core is bypassed and the serial input is connected to a first bank of shift register cells, with the banks of shift register cells connected in series; and
 a bypass mode in which the integrated circuit core is bypassed and hold signals are applied to the hold inputs.

The invention also provides an IEEE STD 1500 wrapper comprising:
 a circuit of the invention, the shift register circuit comprising a Wrapper Boundary Register;
 a Wrapper Instruction Register; and
 a Wrapper Bypass Register.

An integrated circuit cam comprise one or more circuit cores, each with an IEEE STD 1500 wrapper of the invention.

The invention also provides a method of testing an integrated circuit core or circuitry external to an integrated circuit core using a testing circuit, wherein the integrated circuit core is one of a plurality of integrated circuit cores wrapped by the testing circuit, the method comprising:
 passing a test vector from a parallel input of the testing circuit along a shift register circuit, the shift register circuit having a portion associated with each core, wherein the shift register circuit portions are configured to bypass one or more cores not being tested and to provide the test vector to a core scan chain of the core being tested; and configuring the bypassed cores such that the associated shift register circuit portions are driven to a hold mode in which storage elements of the shift register circuit portion have their outputs coupled to their inputs.

This method provides holding of the shift register stages when a core is bypassed, and this means the shift register stages are less prone to errors resulting from changes in clock signals applied to the shift register stages.

The circuit can be operated in a shift mode to shift data along the shift register circuit, and in a test mode to provide testing of a core or external circuitry.

In the test mode, one or more cores are placed in a core internal or core external test mode. The testing circuit can be clocked with different frequency clocks in the test mode and the shift mode, and the method provides tolerance to these changes in clocking signal.

In the core internal test mode, the integrated circuit core outputs are preferably connected to the associated shift register portion, and in the core external test mode the integrated circuit core is bypassed and a serial test input is connected to the associated shift register portion.

An example of the invention will now be described in detail with reference to the accompanying drawings, in which.

The example of the invention described below provides a wrapper architecture in which the WBR cells are arranged in parallel banks, to support the receipt of parallel data from parallel wrapper ports. A first bank of bypass multiplexers are used to implement a bypass of the core so that the parallel inputs pass directly to the banks of WBR cells. During this bypass, the WBR cells are placed in a hold mode, and this enables the architecture to tolerate the use of different clock domains for the internal core testing and for the passing of data along the chain of WBR cells.

Before describing the invention in further detail, a more detailed outline of the wrapper structure and operation will be given.

Figure 1:
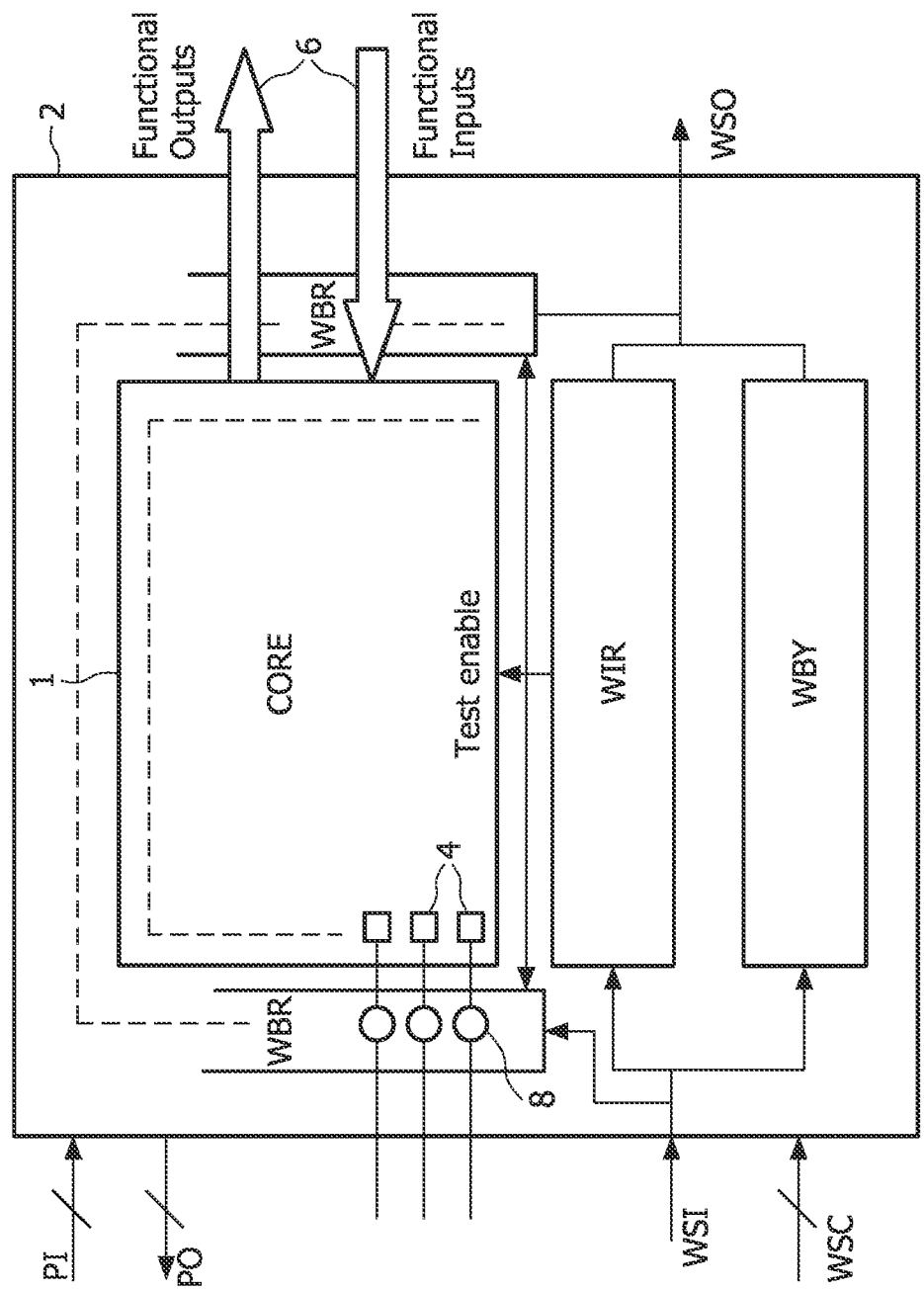
FIG. 1 shows a known testing circuit wrapper for an integrated circuit core.
Figure 2:
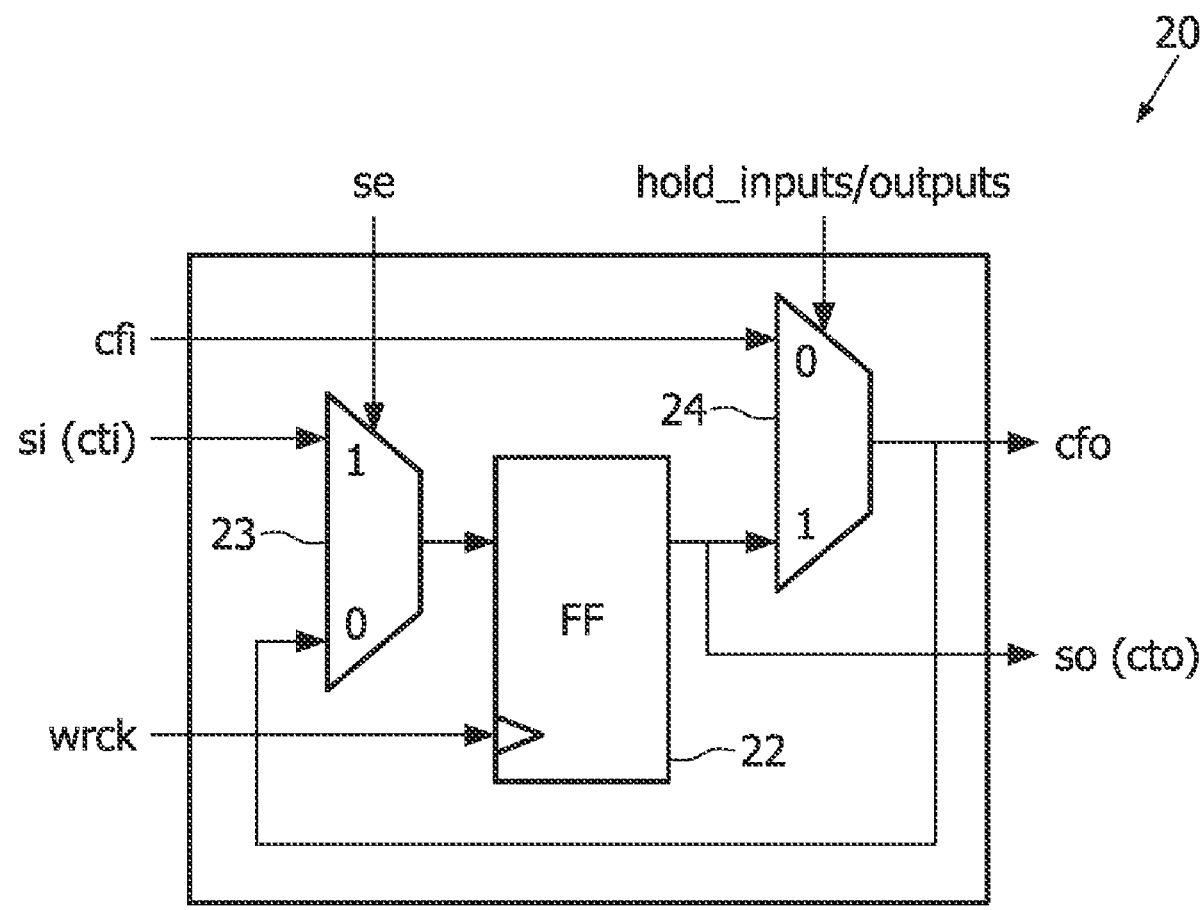
FIG. 2 shows one wrapper boundary cell of the circuit of FIG. 1 in more detail.

As mentioned above, the Wrapper Boundary Register is formed as a plurality of cells, and FIG. 2 shows an example of one such cell 20, corresponding to one of the cells 8 shown in FIG. 1.

This cell can be configured as an input cell or as an output cell. For an input cell, the hold_inputs/outputs signal is "hold_inputs" and for an output cell, the hold_inputs/outputs signal is "hold_outputs".

These hold signals control the WBR cells, and the hold signals are static, to select between core internal (inward facing) and core interconnect (outward facing) tests. The hold signals are generated in response to the interpretation of the WIR instruction, and are controlled in dependence on the selected test (or diagnostic or application) mode. The application mode essentially comprises the disabling of the wrapper to allow normal functionality of the core.

The cell 20 receives a serial input "si", which is the cell test input "cti". This serial input is clocked to the serial output "so", which is the cell test output "cto" by the flip flop 22 when a shift enable control line "se" is high. This shift enable control signal controls a multiplexer 23. The shift enable control line thus controls shifting of signals along the scan chain. Note that the shift enable control lines "se" are related to the command "shiftWR".

For an input cell, in order to provide a signal to the core, in response to a high hold signal at the control line "hold_inputs", the output of the flip flop 22 is provided to the cell functional output "cfo" through multiplexer 24. This is also fed back to the multiplexer 23, and with the shift enable line low, this signal is fed to the flip flop 22 to maintain the cell functional output stable. Thus, a cell test input signal stored in the flip flop is held on the cell test output. The input cell can also observe the environment external to the core, and route this to the serial output.

For an output cell, a signal can be received from the core at the cell function input, and with the hold_outputs signal low, this can be routed (with shift enable low) to the serial output. Similarly, a cell test input can be routed to the cell functional output.

It can be seen that an input cell can provide a test signal to the core, and an output cell can receive a response from the core, and can also provide an outward facing test signal to the circuitry outside the core. These functions are controlled by the hold signal values, which provide the control of the way the WBR operates.

Figure 3:
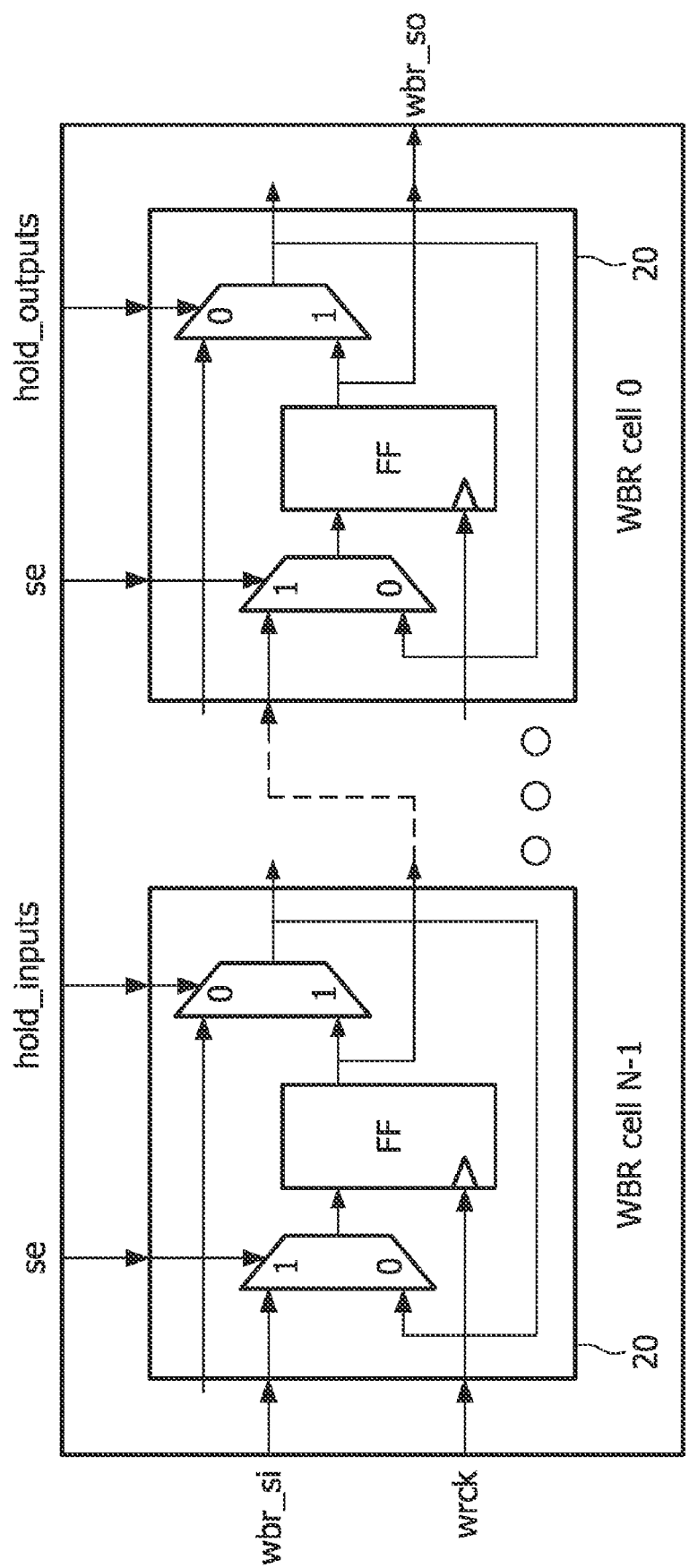
FIG. 3 shows the wrapper boundary register of the circuit of FIG. 1.

FIG. 3 shows multiple cells 20 of FIG. 2 connected in series to define the WBR, which is shown as formed from N cells (numbered 0 to N−1). Some of the cells are configured as input cells (for input terminals of the core) and others are configured as output cells (for output terminals of the core). FIG. 3 thus represents the full WBR shown in FIG. 1.

Figure 4:
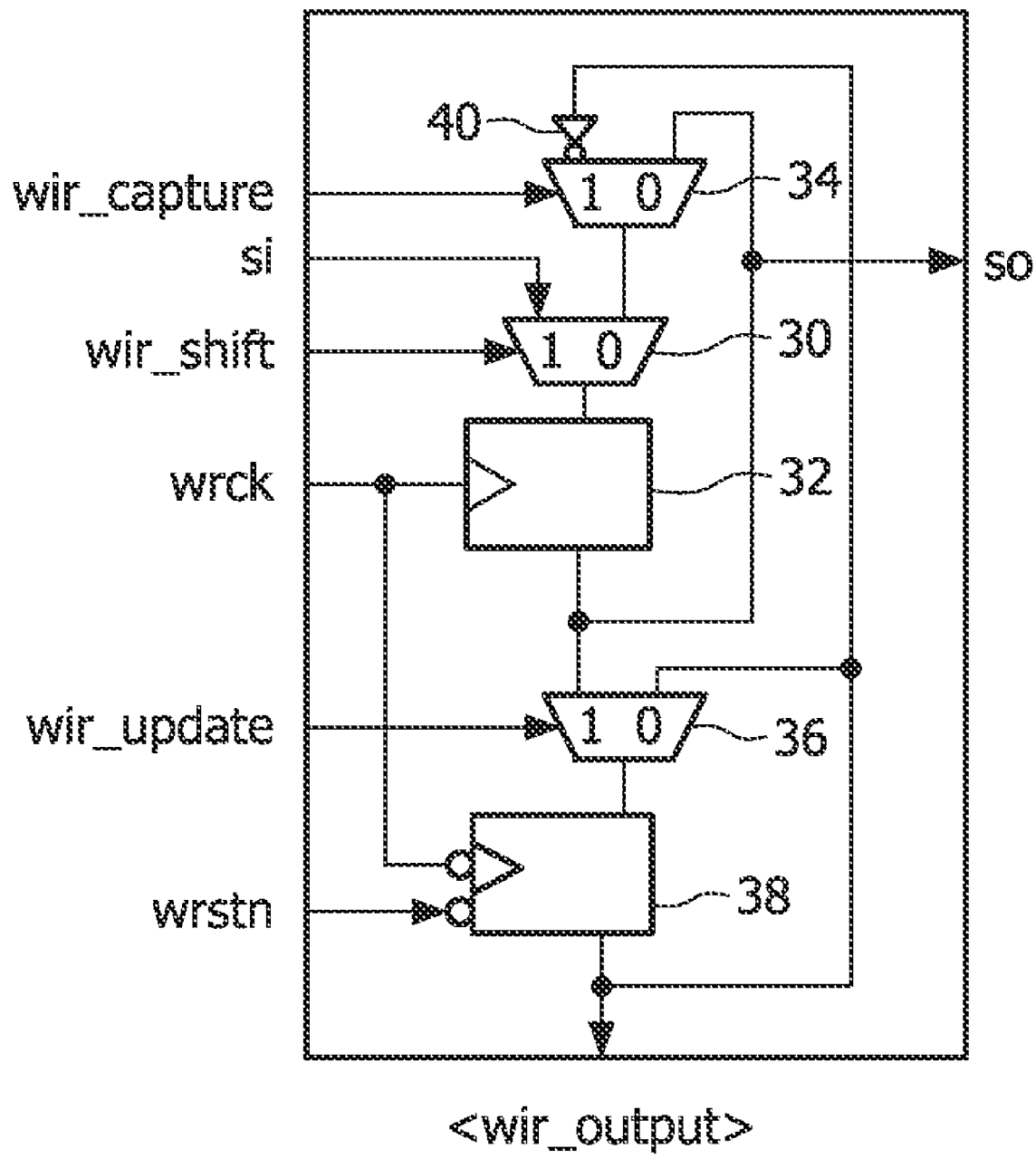
FIG. 4 shows one possible slice architecture for the wrapper instruction register of FIG. 1.

FIG. 4 shows one possible way to implement an instruction register block, forming a building block for the WIR.

FIG. 4 shows the wrapper instruction register "Capture", "Shift" and "Update" signals, as well as the clock "wrck" and reset "wrstn" signals.

The serial input "si" is supplied to the "1" input of a multiplexer 30 which is controlled by the shift signal. When the shift signal is high, this serial input is fed to a first flip flop 32, which clocks the input signal to the serial output "so". This provides a serial chain operation.

The output is also fed back to a second multiplexer 34 which implements the capture function. In the absence of a capture command, the output is fed to the "0" input of the multiplexer 30. This maintains the output stable until the next high shift signal, which replaces the input to the multiplexer 30 with the next serial input value.

The serial output is also provided to a third multiplexer 36, and this passes the output to a second flip flop 38 in response to a high update signal. After an update signal, the output of the flip flop 38 is stable, as the output is fed back to the "0" input of the multiplexer 36. Thus, after the update action, the output of the flip flop 38 is stable and stores the value in the flip flop 32. This defines the wrapper instruction register (WIR) output.

The reset signal resets the WIR output, and the application mode is also implemented (effectively disabling the wrapper) during the reset mode of operation.

It can be seen that the functionality of the circuit shown in FIG. 4 can be selected to:
  shift a serial input to the serial output using the shift signal, and through the flip flop 32;
  load an "external" signal into the flip flop 32, which can in turn be routed to the flip flop 38 or to the serial output.

In FIG. 4, the flip flop 32 forms part of a serial instruction register, and the flip flop 38 forms part of a parallel update register. Data can be loaded into the update register in parallel and independently of the serial operation. Thus, test mode conditions can be stored in the parallel update register, while a new set of test mode conditions (i.e. an instruction) is loaded into the serial shift register.

The circuit of FIG. 4 has additional test functionality, and for this purpose the WIR output is also fed back to the "1" input of the multiplexer 34, through an inverter 40.

This circuit uses the capture signal as an internal test control. When the capture signal goes high, the inverse of the WIR output is supplied to the multiplexer 30, and this in turn is supplied to the flip flop 32 when there is no shift signal input. This inverted WIR output thus can be controlled to propagate through the structure to the WIR output using the update control signal.

Figure 5:
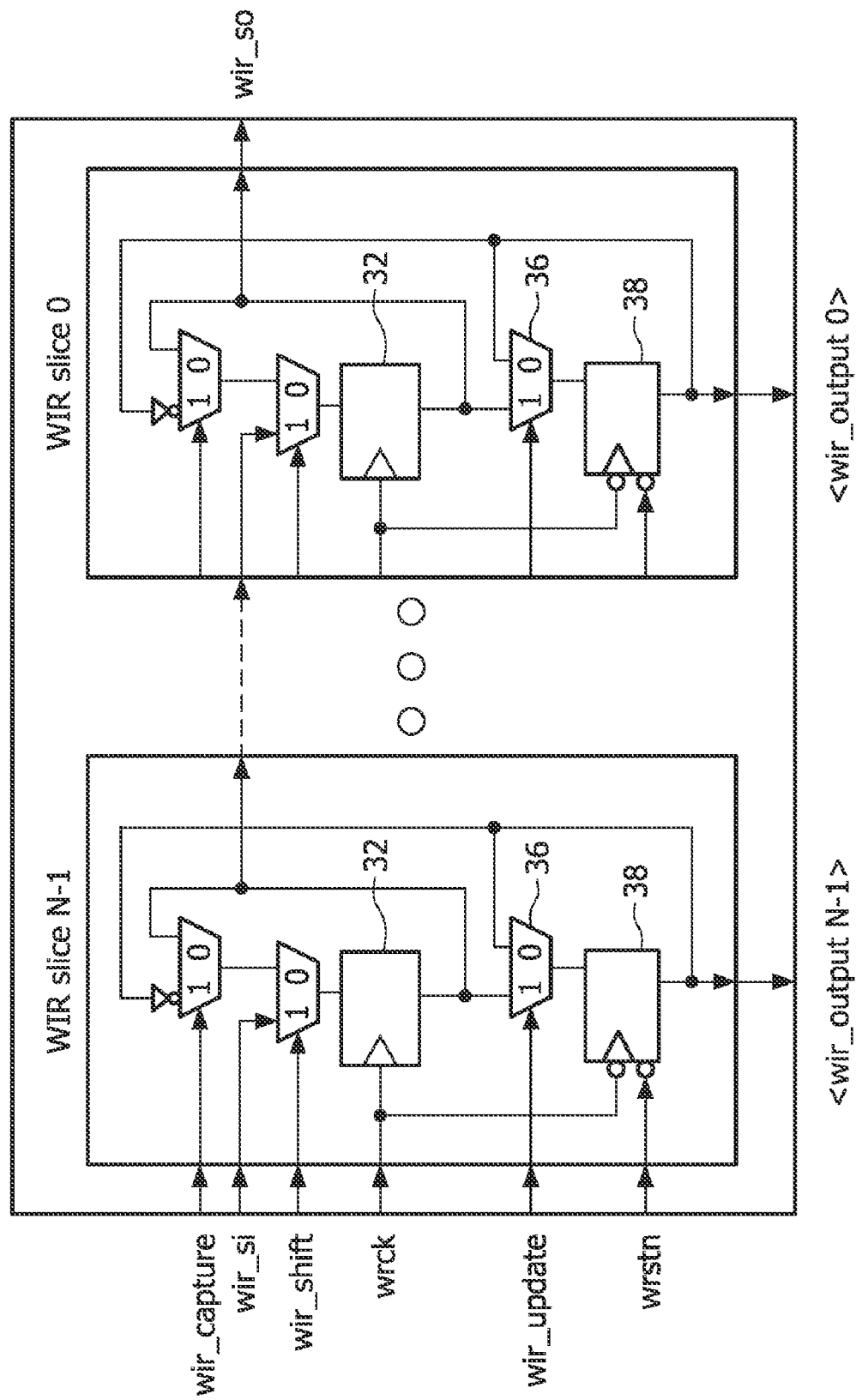
FIG. 5 shows a wrapper instruction register formed using the slices of FIG. 4.

FIG. 4 shows one building block for forming the Wrapper Instruction Register, and FIG. 5 shows the Wrapper Instruction Register formed using the building block of FIG. 5.

As shown, the WIR comprises a series chain of the elements of FIG. 4, with the serial output of one connected to the serial input of the next. All units share the same clock, capture, shift, update and reset signals.

This register provides serial loading of data using the WIR serial input ("si") port and the parallel provision of the WIR output, which can comprise a test vector to be applied to the core under test.

However, the architecture also allows testing of the instruction register, in particular to monitor the propagation of 1s and 0s through the serial flip flops and through the capture and shift multiplexers and the propagation of 1s and 0s through the update flip flops through the update multiplexers. The propagation of 1s and 0s through the series scan chain connections between slices can also be monitored using the serial output.

As mentioned above, the WBR cells are controlled to implement inward facing or outward facing tests (using the hold signals). For efficient core based testing, multiple scan chain configurations are needed to support efficient core internal and core external testing.

For example, multiple cores may be contained within a larger wrapper, and the ability to test a subset of the cores is then desirable. If the test chain for these multiple cores is pipelined to define a continuous transport mechanism, clocking problems can arise which can invalidate data in the pipeline. This can arise when switching between internal chip-generated phase locked loop clocks and external clocks.

Figure 6:
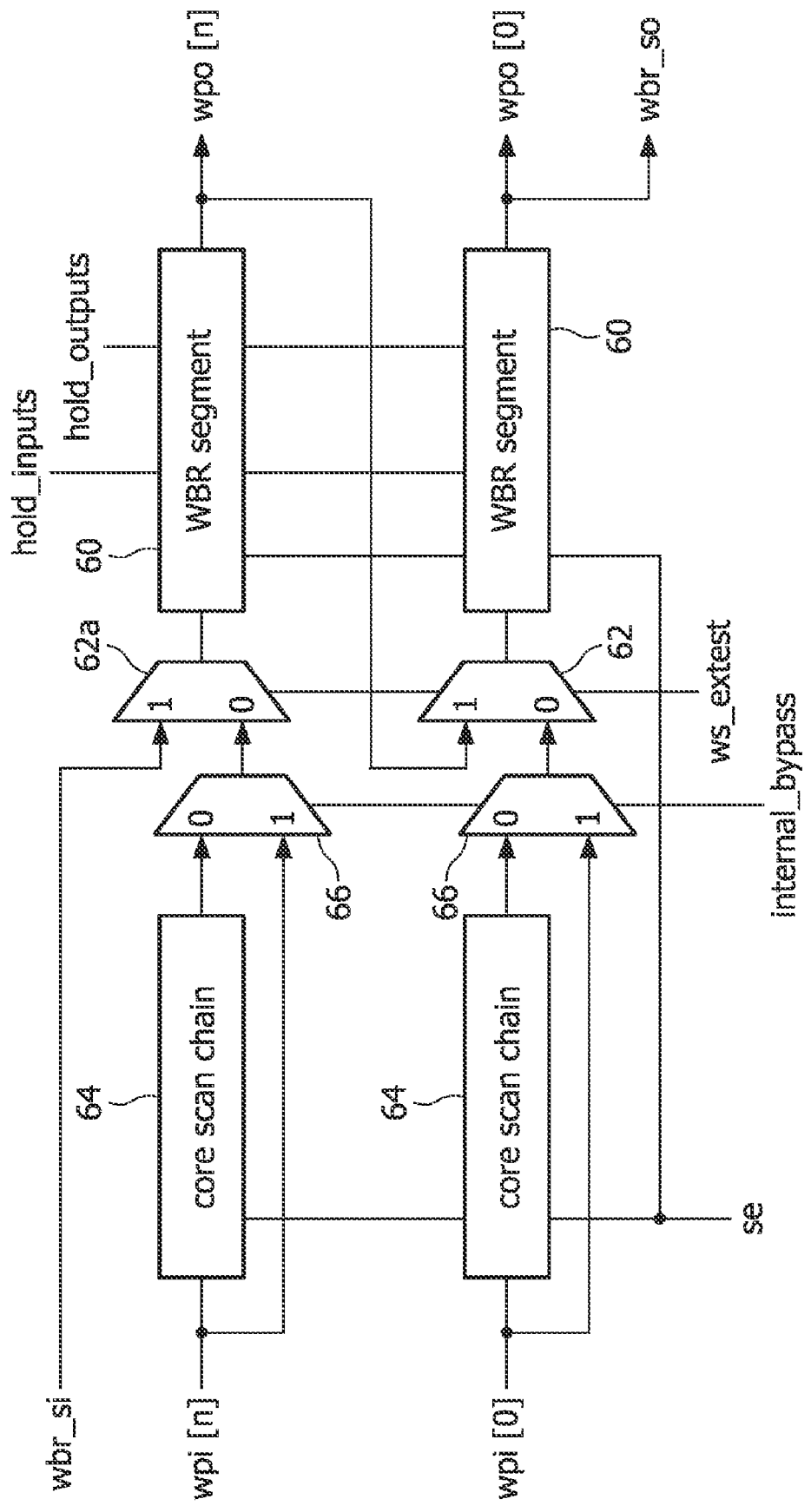
FIG. 6 shows the configuration of the invention for the wrapper boundary register.

FIG. 6 shows a configuration of the invention.

The arrangement of FIG. 6 uses the parallel wrapper inputs to implement a bypass mechanism. This enables a parallel bypass to be implemented without using the serial WBY register and without using substantial additional hardware. For example, the use of additional serial scan elements can be avoided.

In FIG. 6, a number n+1 or parallel wrapper inputs wpi[0] to wpi[n] are shown. This number is less than the number of WBR cells, so that each parallel input needs to supply data to a subset of the WBR cells. Each block 60, entitled WBR segment, is a sub-chain of the WBR cells.

The WBR can be used in an external test mode, "extest", as mentioned above, and FIG. 6 shows how this is implemented. This mode connects the WBR between the wrapper serial input and output. In FIG. 6, a bank of multiplexers 62 is controlled by the "ws_extest" (wrapper serial external test) signal. The high level controls the first multiplexer 62a to couple the serial input wbr_si to the start of the first subset of WBR cells, and to couple the subsets 60 of WBR cells together in series, so that there is a connection from the serial input wbr_si through all WBR cells in series to the serial output wbr_so.

To implement the parallel mode of operation, the external test signal "ws_extest" must be low. The parallel inputs to the wrapper wpi[0] to wpi[n] can either pass through the core scan chains 64 (which are the internal scan chains of the core which is wrapped) or they can bypass the core.

If the core is to be tested, the internal_bypass signal is low, and the parallel inputs are supplied to portions of the core scan chain allocated to each parallel input. The resulting output from the core scan chain portion is routed to a WBR segment 60 through a bank of second multiplexers 66 controlled by the internal_bypass signal and through the first bank of multiplexers 62. The resulting outputs which provide the testing information for the core are coupled out through the WBR segments to the parallel outputs wpo[0] to wpo[n].

The propagation of signals through the core scan chain portions 64 and the WBR segments 60 is under the control of the shift enable signal "se".

In a bypass mode, the bank of multiplexers 66 are controlled to supply the parallel inputs wpi[0] to wpi[n] directly to the WBR segments, bypassing the core scan chains.

As outlined above, the data in the WBR cells (for example of an adjacent core) can be corrupted during the internal test, as a result of the change in clocking signals.

To overcome the clocking problems that can corrupt the other data in the pipeline (the chain of WBR cells), the data is held in the pipeline during the normal test mode.

During the normal test mode, the shift enable signal is low. The WBR cells can placed into a hold mode by providing high hold signals, and these effectively isolate the flip flops of the WBR cells from all external influences, and provides retention of the WBR pipeline data by a feedback control path, with resistance to errors resulting from clocking problems.

The required hold signals are under the control of the WIR in response to a suitable WIR instruction.

Multiple configurations of FIG. 6 can be connected together in series, and this arrangement enables the testing of one core within a series to be carried out without risking the loss of data in neighbouring cores. In particular, the hold signals for one core are used to maintain the WBR data static within the WBR segments.

The architecture shown in FIG. 6 can be used in a number of modes:

A core internal test has the bypass signal low, so that test vectors applied to the parallel ports can be routed to the core scan chain. For this mode, the WBR input cells (see FIG. 2) are held (hold_inputs is 1) so that the cell test input provided to those cells (the test vector) is provided to the core input ports, which connect to the cell functional outputs.

The output cells are not held so that the core response, which is received at the cell functional input "cfi" is fed around the cell flip flop and to the serial output.

A core interconnect (external) test has the bypass signal high, so that test vectors applied to the parallel ports can bypass the core scan chain and can be provided directly to the WBR segments. For this mode, the WBR input cells (see FIG. 2) are not held (hold_inputs is 0) so that the input cells route any signal received from the external circuitry at their cell functional input to the serial output.

The output cells are held (hold_outputs=1) so that the core (which is connected to the cell functional input) is isolated, and the cell test input (the test vector) is held on the cell functional output, which connects to the external circuitry.

A core bypass mode has the bypass signal high, so that test vectors applied to the parallel ports can bypass the core scan chain and can be provided directly to the WBR segments.

For this mode, the WBR input cells and output cells are held (hold_inputs and hold_outputs are 1). The output cells isolate the core outputs and the input cells prevent the external circuitry altering the flip flop data as the cell functional input is isolated. The hold inputs implement a feedback path within the cells, and with the shift enable signal "se" low, this holds the flip flop content of the WBR cells static, and immune to clocking frequency changes and irregularities. This mode also isolates the core scan chain from the pipeline.

When the shift enable signal is high, for serial shifting of data along the WBR cell chain, the hold input and hold output signals remain high, and this does not prohibit the correct serial passage of data from the serial input to the serial output.

The architecture outlined above enables continuous shifting wrapper chain segments, so that no delays are introduced by additional sequential shift elements, and enables secure storage of the WBR cell data during core testing of other cores within a multiple wrapper arrangement.

It can be seen that this architecture provides a pipeline implementation that is robust against high frequency and/or non-continuous clocks during normal test mode cycles. The architecture also enables efficient interconnect testing, without requiring additional sequential elements.

When the low frequency tester clock is used (for example ones or tens of MHz data is shifted in the WBR cell pipeline. The pipeline holds its data during normal mode test cycles at the higher frequencies (for example tens or hundreds of MHz).

The architecture thus provides the predictable pipeline behaviour that is needed for the test schedule calculation.

The invention has been described with reference to the IEEE STD 1500 wrapper architecture. However, the invention is applicable more generally to registers used in core testing architectures in which parallel and serial inputs are provided.

The term multiplexer has been used above, and this is simply intended to be interpreted as a controllable switching device, in particular for routing one of many inputs to one or more outputs.

Various other modifications will be apparent to those skilled in the art.

The invention claimed is:

1. A testing circuit for the testing of an integrated circuit core or circuitry external to an integrated circuit core, the testing circuit comprising:
    a shift register circuit (WBR) comprising a plurality of cells, for passing test signals, the cells being arranged as a plurality of banks of cells in series;
    a serial input and a serial output for connection to the input and output of the shift register circuit;
    a plurality of parallel inputs and outputs, wherein the parallel inputs are for passing test signals to the integrated circuit core for testing of the core,
    wherein a first bank of bypass multiplexers is controllable either to connect integrated circuit core outputs to the multiplexer outputs or to connect the parallel inputs to the multiplexer outputs thereby bypassing the integrated circuit core,
    wherein each cell comprises a hold input, wherein the hold input is for coupling the output of a storage element of the cell to the input of the storage element of the cell when the testing circuit is operated in a test mode,
    wherein the testing circuit is operable in a bypass mode in which the integrated circuit core is bypassed and hold signals are applied to the hold inputs, and
    wherein the testing circuit is further operable in:
        a core internal test mode, in which the integrated circuit core outputs are connected through the multiplexers to the banks of shift register cells; and
        a core external test mode, in which the integrated circuit core is bypassed and the serial input is connected to a first bank of shift register cells, with the banks of shift register cells connected in series.

2. The testing circuit as claimed in claim 1, wherein the testing circuit is further operable in a shift mode.

3. The testing circuit as claimed in claim 2, wherein the testing circuit is clocked with different frequency clocks in the core internal test mode and the shift mode.

4. The testing circuit as claimed in claim 1, wherein the outputs of the bypass multiplexers are connectable to the banks of shift register cells.

5. The testing circuit as claimed in claim 1, wherein each cell has a serial test input, a serial test output, a functional input and a functional output.

6. The testing circuit as claimed in claim 1, wherein each cell is configured as one of:
    an input cell for providing signals to the core; and
    an output cell for receiving signals from the core.

7. The testing circuit as claimed in claim 1, wherein the first bank of multiplexers are controlled by a bypass control line.

8. The testing circuit as claimed in claim 1, wherein the shift register circuit comprises a Wrapper Boundary Register for an embedded core test architecture.

9. The testing circuit as claimed in claim 8, wherein the shift register circuit comprises a Wrapper Boundary Register for a IEEE STD 1500 embedded core test architecture.

10. The testing circuit as claimed in claim 1, wherein the cells of the shift register circuit each comprise a first flip flop.

11. The testing circuit as claimed in claim 1, wherein a second bank of multiplexers is controllable either to connect the outputs of the bypass multiplexers to the banks of the shift register cells in parallel or to connect the banks of cells in series, and wherein a first multiplexer of the second bank of multiplexers either connects the output of a first multiplexer of the first bank of multiplexers a first bank of cells or else connects the serial input to the first bank of cells.

12. The testing circuit as claimed in claim 1, wherein an output of a last bank of cells comprises the serial output.

13. The testing circuit as claimed in claim 1, wherein the parallel outputs are defined at the outputs of the banks of cells.

14. An IEEE STD 1500 wrapper comprising:
    a testing circuit as claimed in claim 1, the shift register circuit comprising a Wrapper Boundary Register;
    a Wrapper Instruction Register; and
    a Wrapper Bypass Register.

15. An integrated circuit comprising a circuit core and an IEEE STD 1500 wrapper as claimed in claim 14.

16. An integrated circuit comprising a plurality of circuit cores, each with an IEEE STD 1500 wrapper as claimed in claim 14, and a further wrapper around the plurality of wrapped cores.

17. A method of testing an integrated circuit core or circuitry external to an integrated circuit core using a testing circuit, wherein the integrated circuit core is one of a plurality of integrated circuit cores wrapped by the testing circuit, the method comprising:
    passing a test vector from a parallel input of the testing circuit along a shift register circuit, the shift register circuit having a portion associated with each core, wherein the shift register circuit portions are configured to bypass one or more cores not being tested and to provide the test vector to a core scan chain of the core being tested;

configuring the bypassed cores such that the associated shift register circuit portions are driven to a hold mode in which storage elements of the shift register circuit portion have outputs coupled to inputs; and operating the testing circuit in a shift mode to shift data along the shift register circuit and in a test mode to provide testing of a core or external circuitry.

18. The method as claimed in claim 17, wherein in the test mode, one or more cores are placed in a core internal or core external test mode.

19. The method as claimed in claim 18, wherein the testing circuit is clocked with different frequency clocks in the test mode and the shift mode.

20. The method as claimed in claim 18, wherein in the core internal test mode, the integrated circuit core outputs are connected to the associated shift register portion, and in the core external test mode the integrated circuit core is bypassed and a serial test input is connected to the associated shift register portion.

21. The method as claimed in claim 17, wherein the shift register circuit comprises a Wrapper Boundary Register for an embedded core test architecture.

22. The method as claimed in claim 21, wherein the shift register circuit comprises a Wrapper Boundary Register for a IEEE STD 1500 embedded core test architecture.

* * * * *